United States Patent
Chen

(10) Patent No.: US 9,395,570 B1
(45) Date of Patent: Jul. 19, 2016

(54) DISPLAY PANEL MANUFACTURING METHOD

(71) Applicant: HON HAI PRECISION INDUSTRY CO., LTD., New Taipei (TW)

(72) Inventor: Chih-Fang Chen, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/715,283

(22) Filed: May 18, 2015

(30) Foreign Application Priority Data

Apr. 9, 2015 (TW) .............................. 104111454 A

(51) Int. Cl.
| | |
|---|---|
| *H01L 25/065* | (2006.01) |
| *G02F 1/1333* | (2006.01) |
| *G02F 1/1341* | (2006.01) |
| *G02F 1/1368* | (2006.01) |
| *G02F 1/1335* | (2006.01) |
| *G02F 1/1339* | (2006.01) |
| *H01L 27/12* | (2006.01) |

(52) U.S. Cl.
CPC ........ *G02F 1/133308* (2013.01); *G02F 1/1341* (2013.01); *G02F 1/1368* (2013.01); *G02F 1/13394* (2013.01); *G02F 1/133516* (2013.01); *H01L 25/0655* (2013.01); *H01L 27/1218* (2013.01); *G02F 2001/13398* (2013.01); *G02F 2001/133325* (2013.01)

(58) Field of Classification Search
None
See application file for complete search history.

(56) References Cited

U.S. PATENT DOCUMENTS

2014/0353637 A1* 12/2014 Kawata ............... H01L 27/3272
257/40

* cited by examiner

*Primary Examiner* — Cheung Lee
(74) *Attorney, Agent, or Firm* — ScienBiziP, P.C.

(57) ABSTRACT

A method for manufacturing a display panel is provided. A plurality of first spacers and a first frame are formed on a first transfer base, and a plurality of second spacers and a second frame are formed on a second transfer base. A first substrate and a second substrate are respectively attached to the first transfer base and the second transfer base to form a first substrate combination and a second substrate combination respectively. A TFT array is formed on a surface of the first substrate, and a color filter layer is formed on a surface of the second substrate. The first substrate combination is reversed to be attached to the second substrate combination. Air paths are formed on the first frame and the second frame for peeling the first transfer base and the second transfer base, thus the display panel is removed after the peeling operation.

18 Claims, 12 Drawing Sheets

DISPLAY PANEL MANUFACTURING METHOD

CROSS-REFERENCE TO RELATED APPLICATIONS

This application claims priority to Taiwanese Patent Application No. 104111454 filed on Apr. 9, 2015, the contents of which are incorporated by reference herein.

FIELD

The subject matter herein generally relates to a manufacturing method for manufacturing a display panel.

BACKGROUND

Liquid crystal display (LCD) includes a display panel. The display panel includes a first substrate with thin film transistors array, a second substrate with a color reflecting layer, and liquid crystal sandwiched between the first substrate and the second substrate. A thickness of the assembled first substrate and the second substrate are decreased with hydrofluoric acid etching.

BRIEF DESCRIPTION OF THE FIGURES

Implementations of the present technology will now be described, by way of example only, with reference to the attached figures.

DETAILED DESCRIPTION

Figure 1:
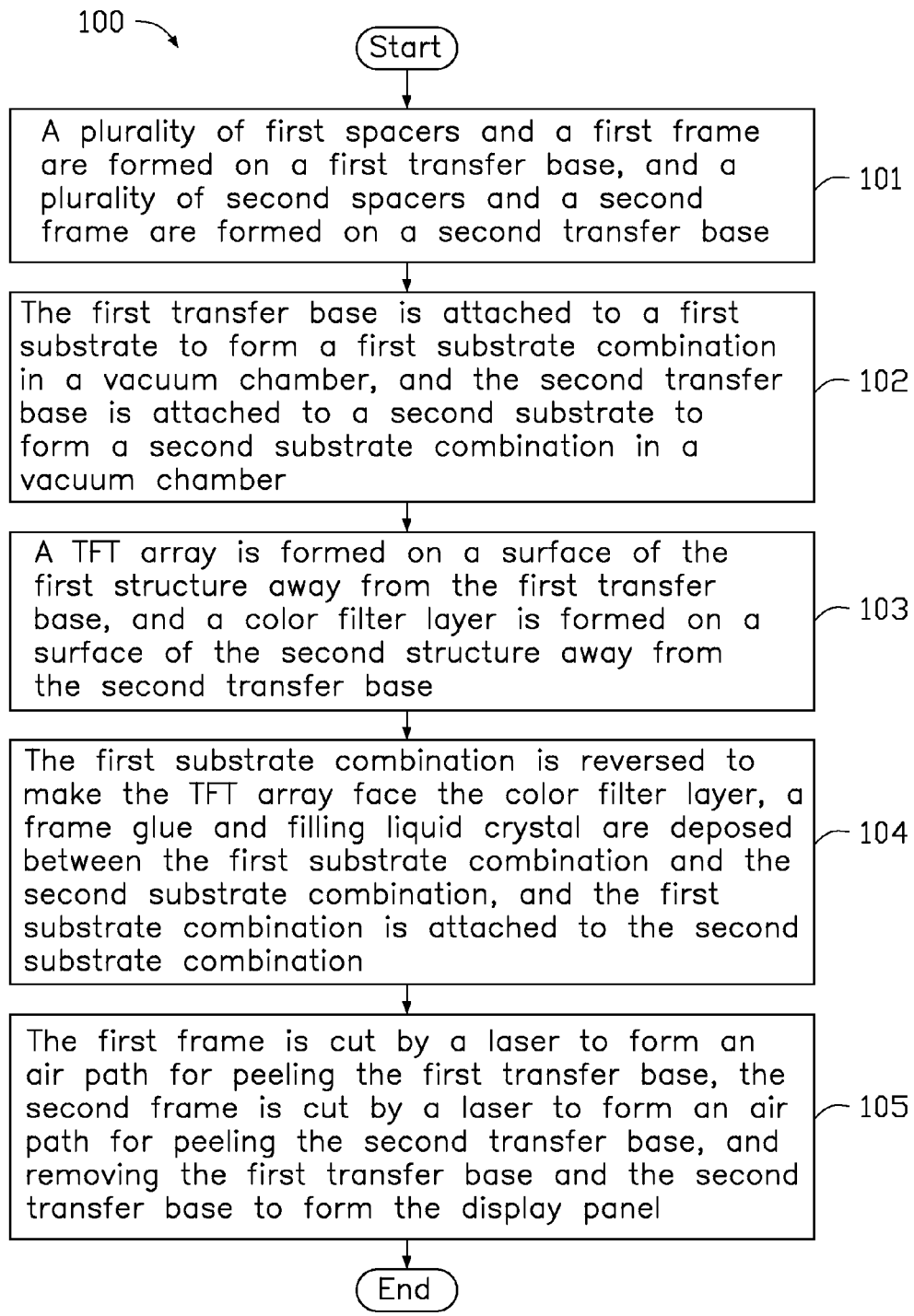
FIG. 1 is a flowchart of a first embodiment of manufacturing method for manufacturing a display panel, the display panel comprising a first substrate combination and a second substrate combination.
Figure 2:
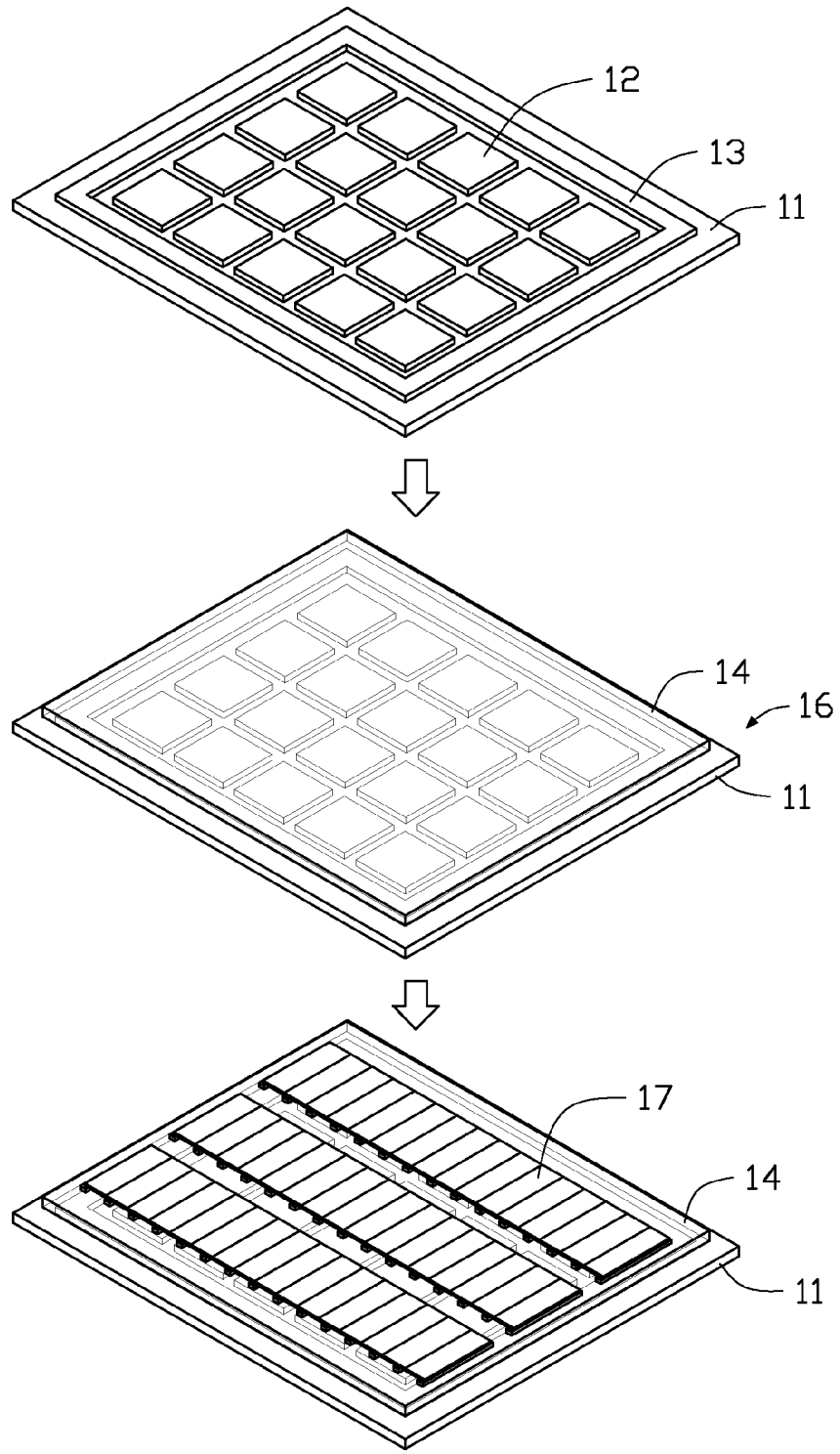
FIG. 2 is an isometric view of an embodiment of the first substrate combination in different blocks of the manufacturing process of FIG. 1, the first substrate combination comprising a plurality of first spacers.
Figure 3:
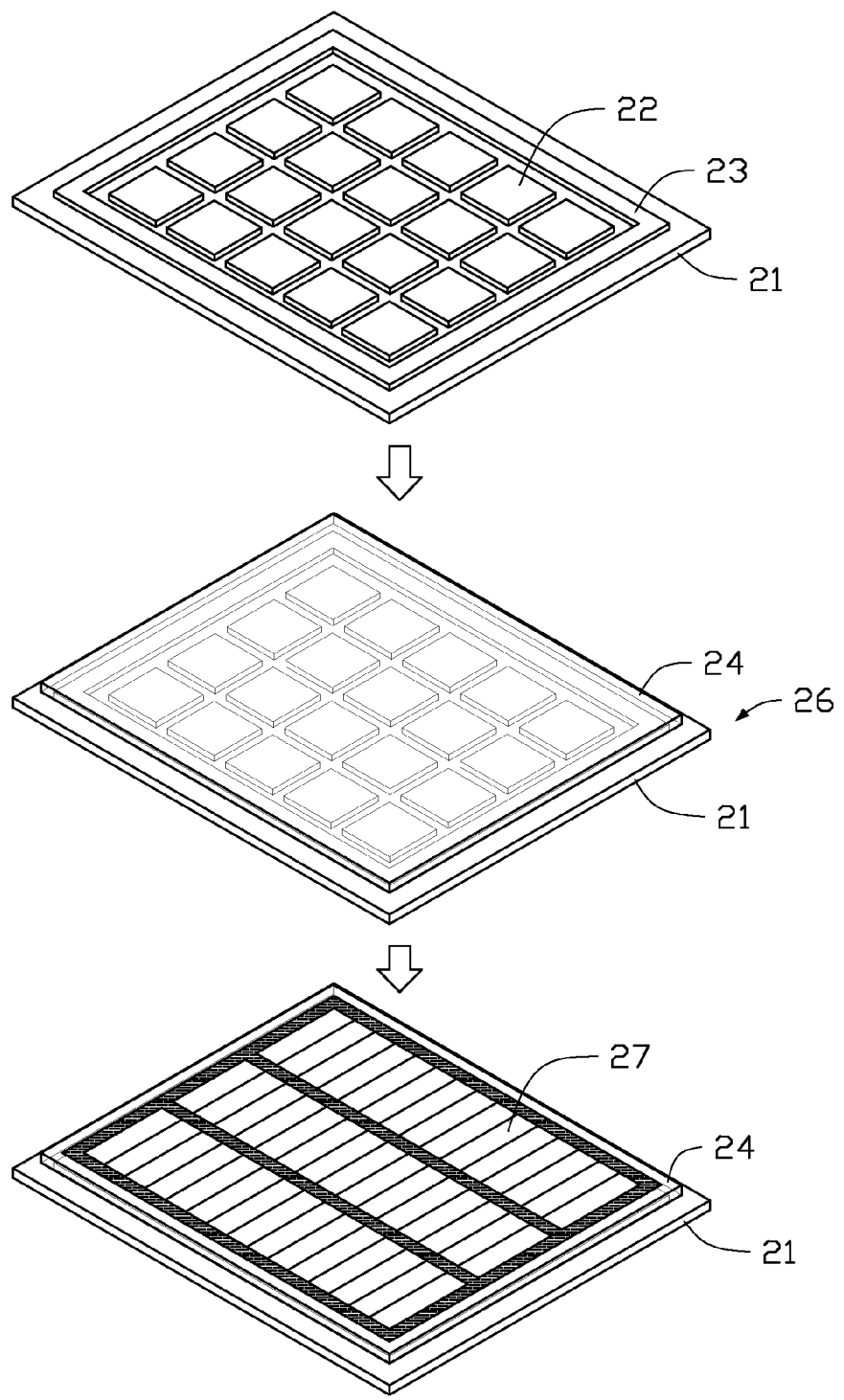
FIG. 3 is an isometric view of an embodiment of the second substrate combination in different blocks of the manufacturing process of FIG. 1.
Figure 4:
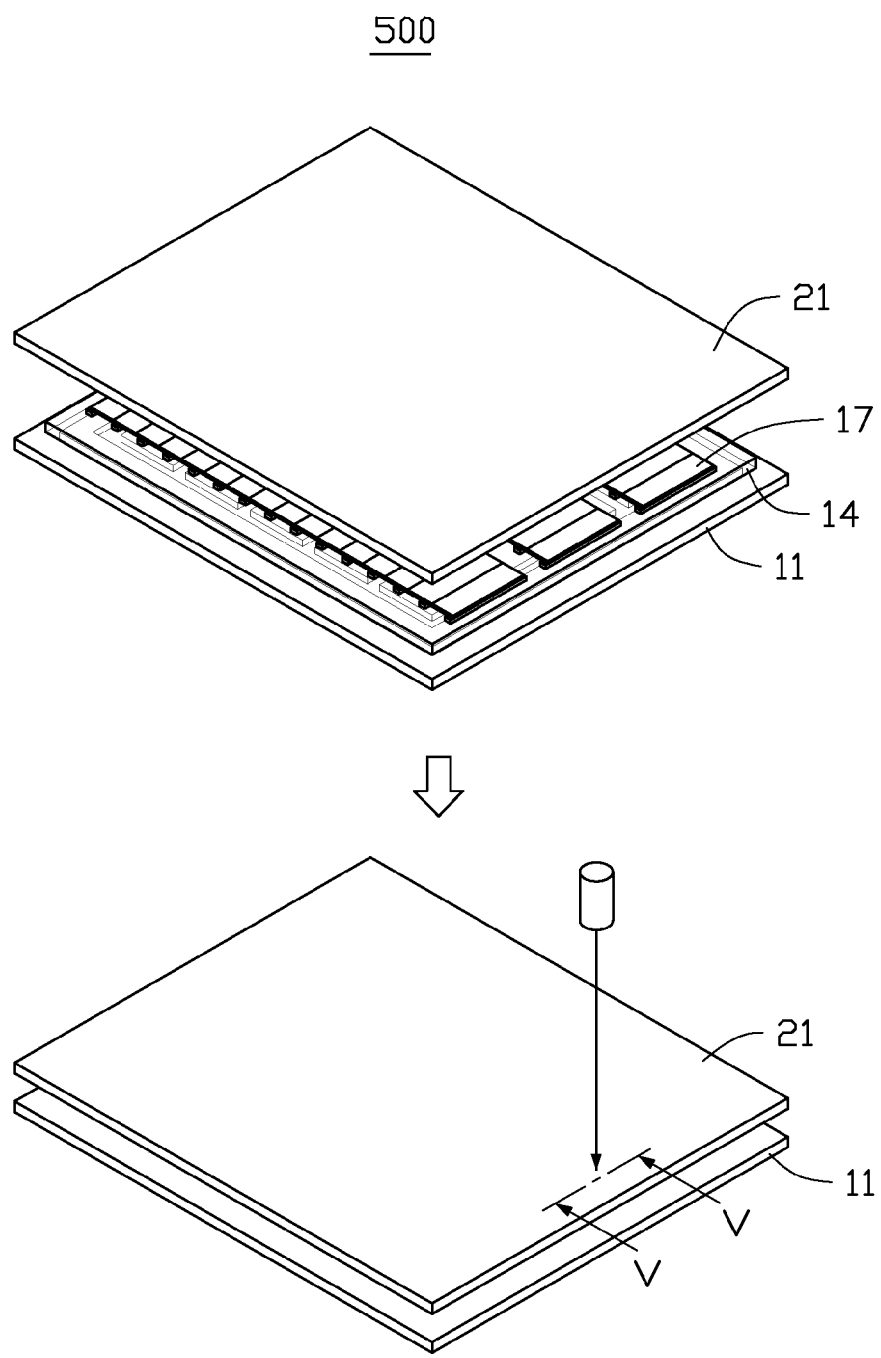
FIG. 4 is an isometric view of an embodiment of the first substrate combination and the second substrate combination in different blocks of the manufacturing process of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates a flowchart of a first embodiment of a manufacturing method 100 for manufacturing a display panel. In at least one embodiment, the display panel is a thin film transistor liquid crystal display (TFT-LICD) type panel. In other embodiments, the display panel is an active-matrix organic light emitting diode (AMOLED) type panel. The method 100 is provided by way of example, as there are a variety of ways to carry out the method. The method 100 described below can be carried out using the configurations illustrated in FIGS. 2-5, for example, and various elements of these figures are referenced in explaining the method 100. Each block shown in FIG. 1 represents one or more processes, methods or subroutines, carried out in the method 100. Furthermore, the order of blocks is illustrative only and the order of the blocks can change according to the present disclosure. Additional blocks can be added or blocks can be removed, without departing from this disclosure. The method 100 can begin at block 101.

In block 101, a plurality of first spacers 12 and a first frame 13 are formed on a first transfer base 11, and a plurality of second spacers 22 and a second frame 23 are formed on a second transfer base 21. The first spacer 12 is located in the first frame 13 in a matrix, and the second spacer 22 is located in the second frame 23 in a matrix. An upper surface of the first frame 13 away from the first transfer base 11 is a smooth plane, and an upper surface of the second frame 23 away from the second transfer base 21 is a smooth plane. The structure of the first spacer 11 is equivalent to the structure of the second spacer 21, and the structure of the first frame 13 is equivalent to the structure of the second frame 23. In at least one embodiment, the first spacers 12 and the first frame 13 are integrally formed via a predetermined mask in a photolithography manner, and the second spacers 22 and the second frame 23 are integrally formed via a predetermined mask in a photolithography manner. The first spacer 12 and the second spacer 22 are substantially rectangular shaped. The first transfer base 11 and the second transfer base 21 are transparent glass substrates. In other embodiments, a shape of the first spacer 11 is different from a shape of the second spacer 21. The first spacers 11 and the second spacers 21 are arranged in a circle.

In block 102, the first transfer base 11 is attached to a first substrate 14 to form a first substrate combination 16 in a vacuum chamber, and the second transfer base 21 is attached to a second substrate 24 to form a second substrate combination 26 in a vacuum chamber. A thickness of the first substrate 14 is in a range between 0.1-0.3 millimeter (mm), and a thickness of the second substrate 24 is in a range between 0.1-0.3 mm. In at least one embodiment, the thickness of the first substrate 14 is 0.2 mm, and the thickness of the second substrate 24 is 0.2 mm.

In detail, in the chamber, the first transfer base 11 faces the first substrate 14. The first transfer base 11 is attached to the first substrate 14 in response to a vacuuming of the chamber. The first transfer base 11 cooperates with the first substrate 14 and the first frame 13 to define a vacuum space. The first spacer 11 evenly supports the first substrate 14. In the chamber, the second transfer base 21 faces the second substrate 24. The second transfer base 21 is attached to the second substrate 24 in response to a vacuuming of the chamber. The second transfer base 21 cooperates with the second substrate 24 and the second frame 23 to define a vacuum space. The second spacer 21 evenly supports the second substrate 24. In at least one embodiment, the first substrate combination 16 and the second substrate combination 26 are formed in different chambers. In other embodiments, the first substrate combination 16 and the second substrate combination 26 are orderly formed in the same chamber.

In block 103, a thin film transistor (TFT) array 17 is formed on a surface of the first substrate 14 away from the first transfer base 11, and a color filter layer 27 is formed on a surface of the second substrate 24 away from the second transfer base 21.

In block 104, the first substrate combination 16 is reversed to make the TFT array 17 face the color filter layer 27, a frame glue and filling liquid crystal is deposed between the first substrate combination 16 and the second substrate combination 26, and the first substrate combination 16 is attached to the second substrate combination 26.

Figure 5:
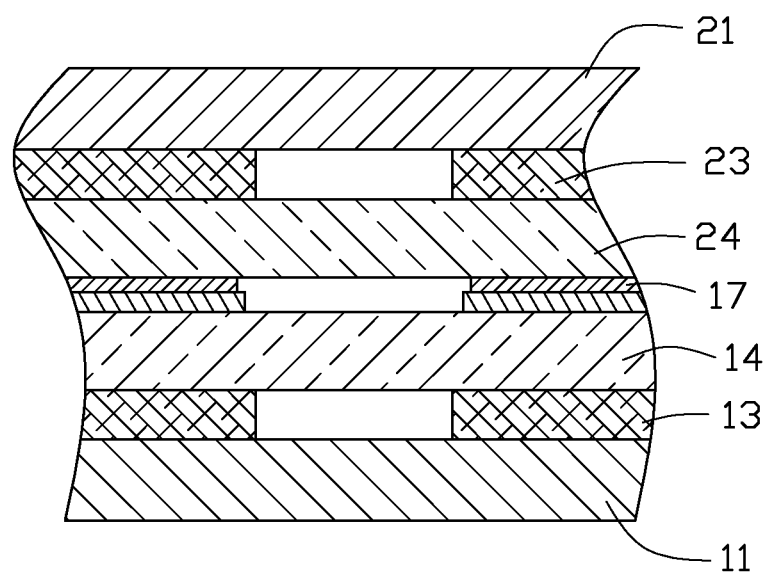
FIG. 5 is a cross-section taken along V-V of an embodiment of the first substrate combination and the second substrate combination of FIG. 4.

In block 105, the first frame 13 is cut by a laser to form an air path for peeling the first transfer base 11 (as shown in FIG. 5), the second frame 23 is cut by a laser to form an air path for peeling the second transfer base 21, and the first transfer base 11 and the second transfer base 21 are removed to form the display panel. In at least one embodiment, the laser cuts a region of the first frame 13 corresponding to a gap between two adjacent first spacers 12, and cuts a region of the second frame 23 corresponding to a gap between two adjacent second spacers 22.

Figure 6:
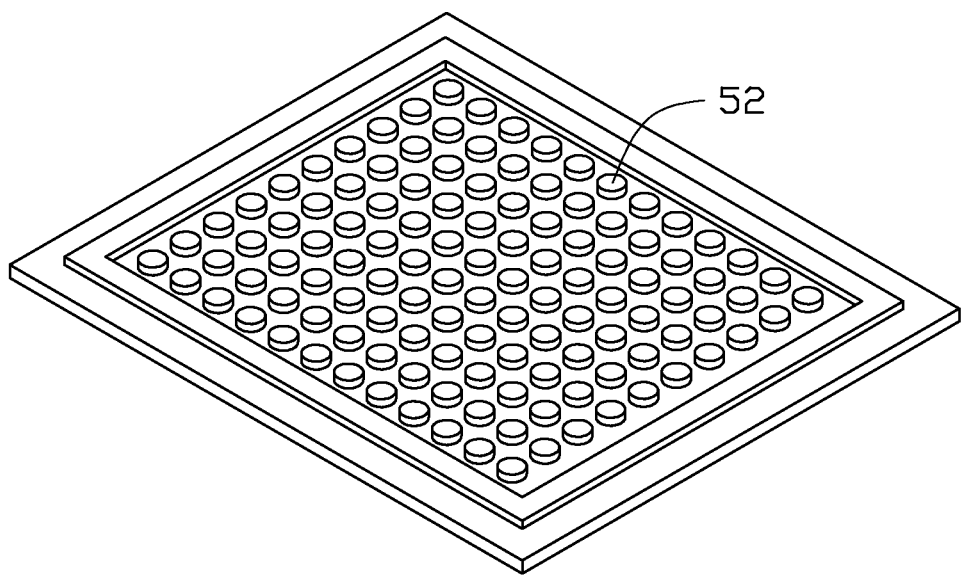
FIG. 6 is an isometric view of a second embodiment of the first spacer of FIG. 2.

FIG. 6 illustrates a second embodiment of the first spacer 52. The first spacer 52 is substantially cylinder shaped.

Figure 7:
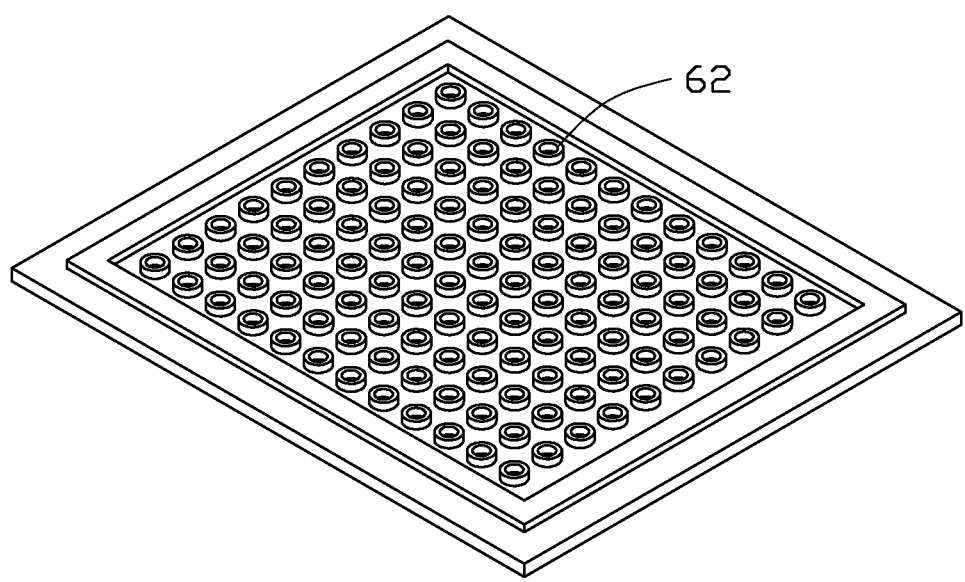
FIG. 7 is an isometric view of a third embodiment of the first spacer of FIG. 2.

FIG. 7 illustrates a third embodiment of the first spacer 62. The first spacer 62 is substantially a hollow cylinder shaped.

Figure 8:
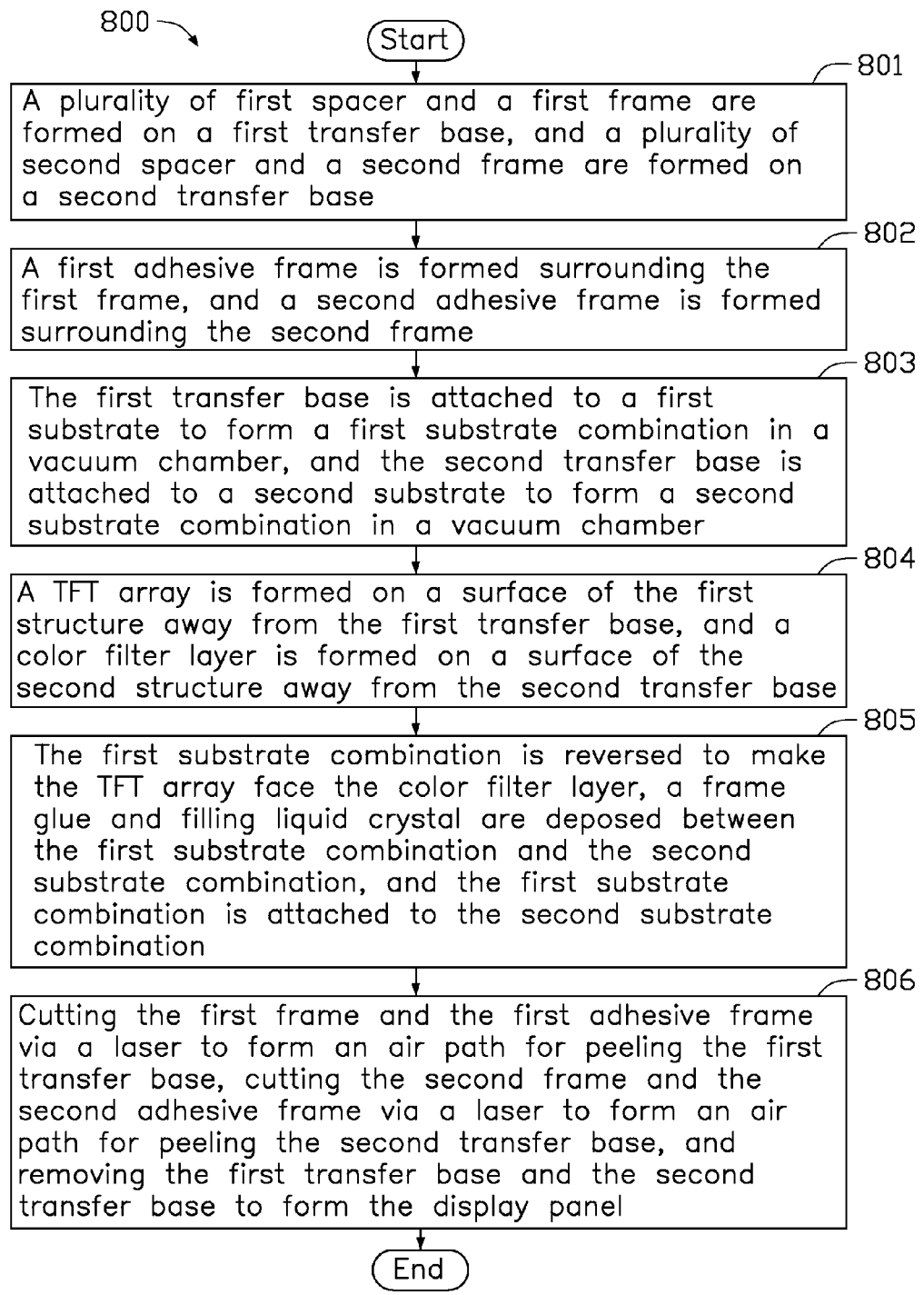
FIG. 8 is a flowchart of a second embodiment of manufacturing method for manufacturing a display panel, the display panel comprising a first substrate combination and a second substrate combination.
Figure 9:
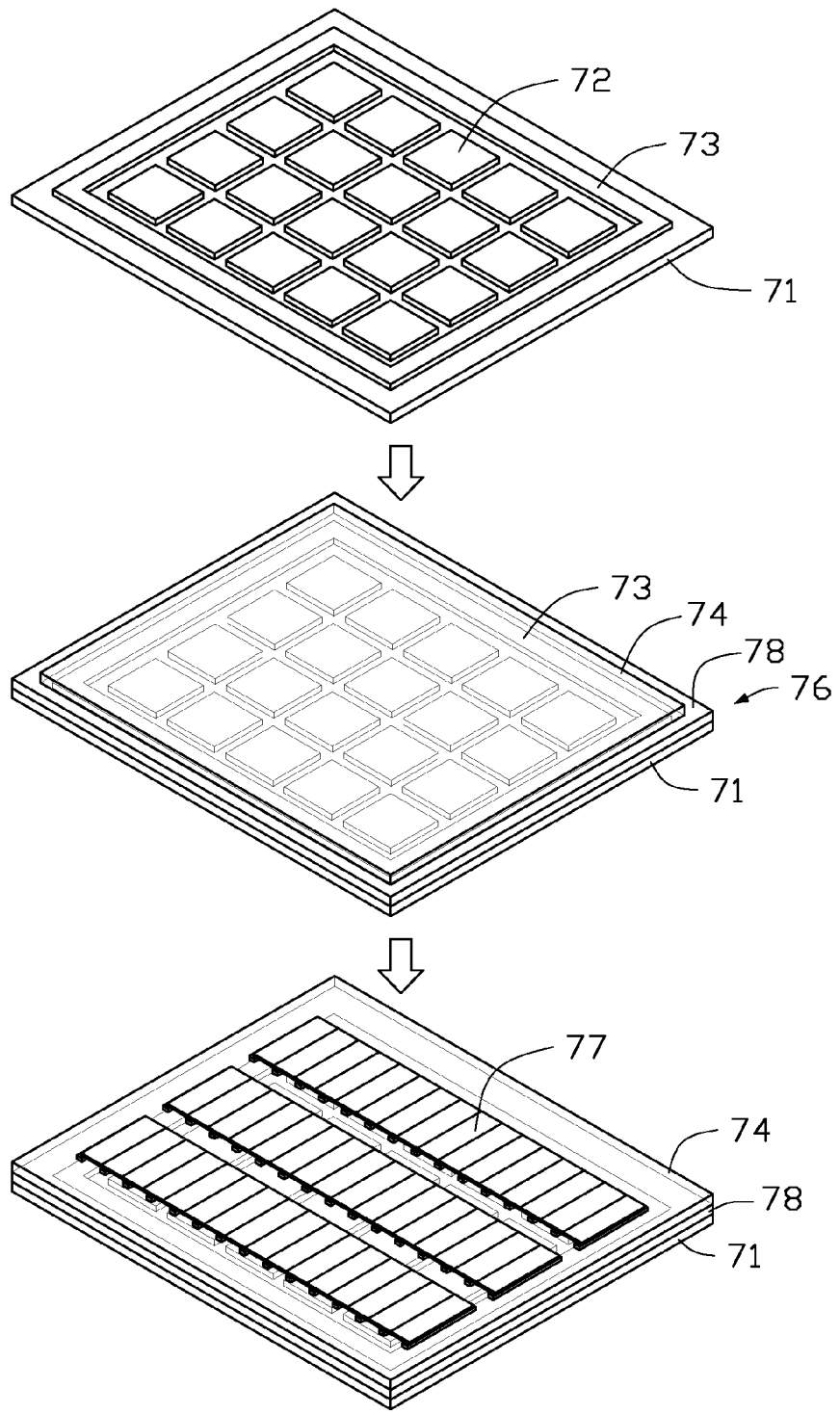
FIG. 9 is an isometric view of an embodiment of the first substrate in different blocks of the manufacturing process of FIG. 8.
Figure 10:
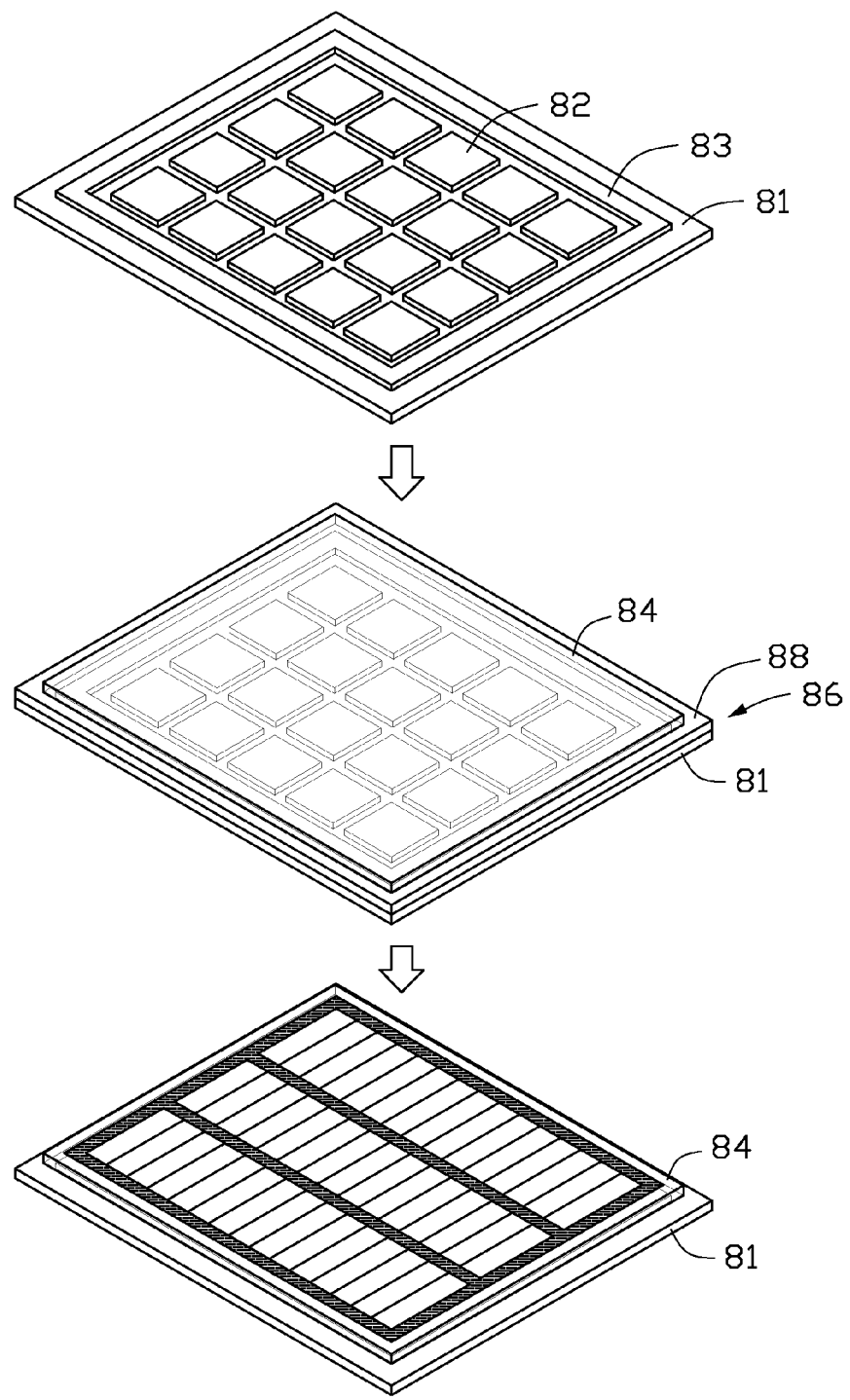
FIG. 10 is an isometric view of an embodiment of an isometric view of an embodiment of the second substrate combination in different blocks of the manufacturing process of FIG. 8.
Figure 11:
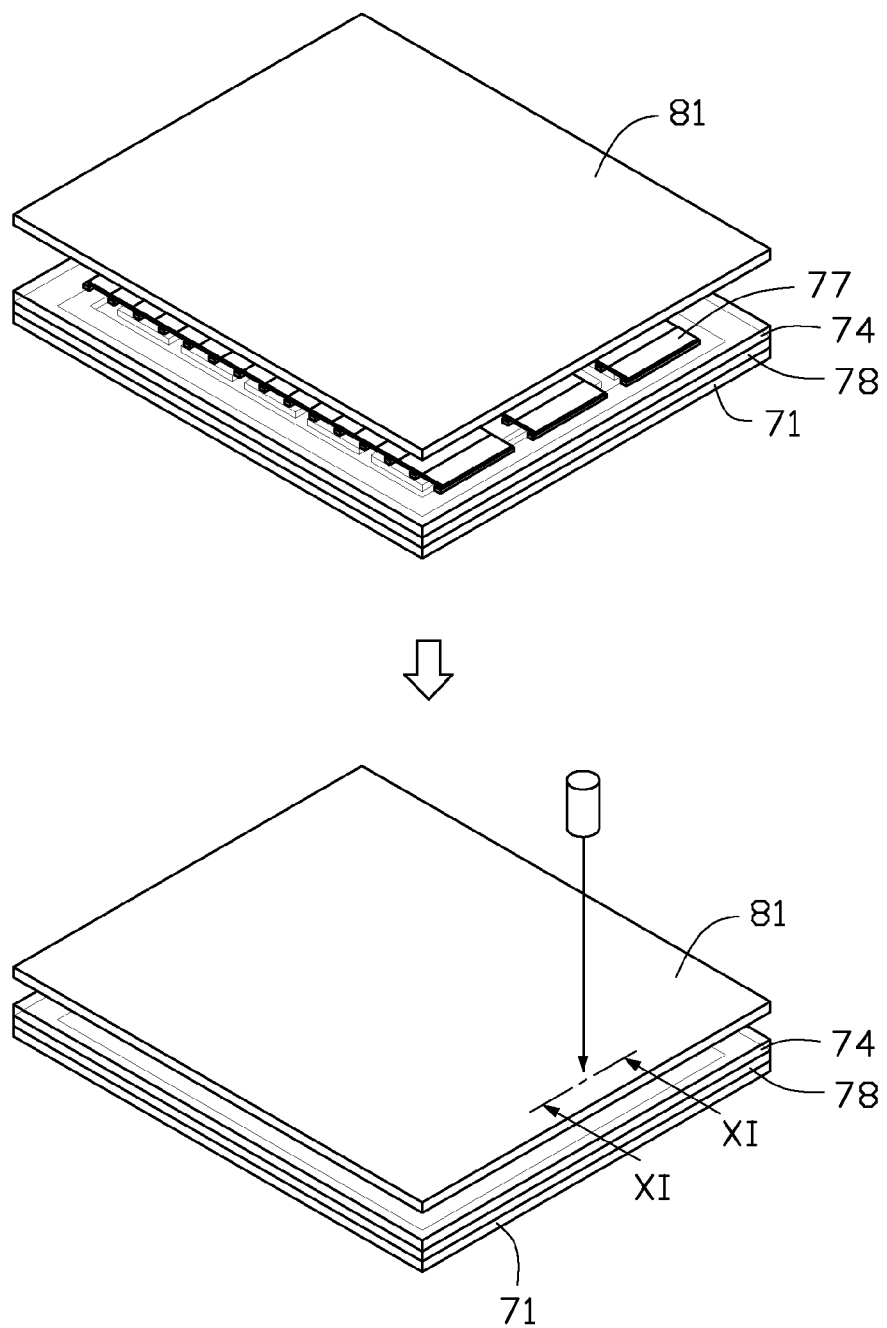
FIG. 11 is an isometric view of an embodiment of an isometric view of an embodiment of the first substrate combination and the second substrate in different blocks of the manufacturing process of FIG. 8.
Figure 12:
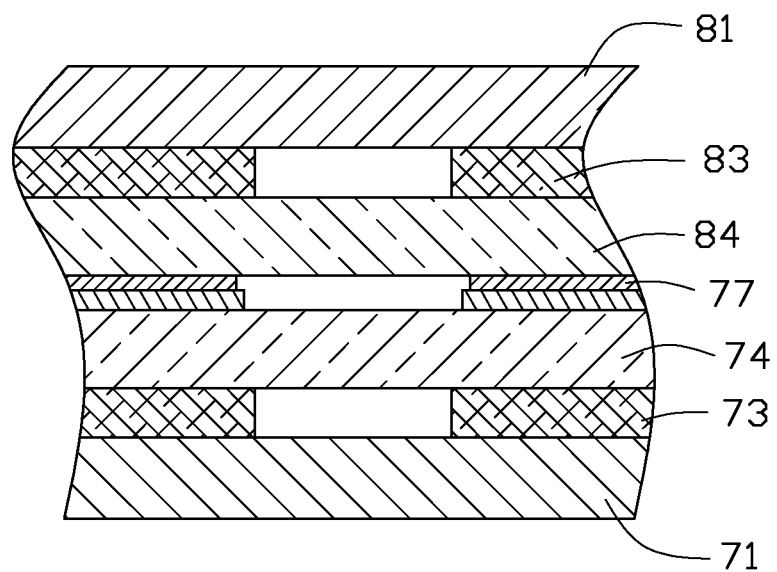
FIG. 12 is a cross-section taken along XI-XI of an embodiment of the first substrate and the second substrate of FIG. 11.

FIG. 8 illustrates a flowchart of a second embodiment of manufacturing method 800 for manufacturing a display panel. In at least one embodiment, the display panel is a thin film transistor liquid crystal display (TFT-LICD) type panel. In other embodiments, the display panel is an active-matrix organic light emitting diode (AMOLED) type panel. The method 800 is provided by way of example, as there are a variety of ways to carry out the method. The method 800 described below can be carried out using the configurations illustrated in FIGS. 9-12, for example, and various elements of these figures are referenced in explaining the method 800. Each block shown in FIG. 8 represents one or more processes, methods or subroutines, carried out in the method 800. Furthermore, the order of blocks is illustrative only and the order of the blocks can change according to the present disclosure. Additional blocks can be added or blocks can be removed, without departing from this disclosure. The method 800 can begin at block 801.

In block 801, a plurality of first spacers 72 and a first frame 73 are formed on a first transfer base 71, and a plurality of second spacers 82 and a second frame 83 are formed on a second transfer base 81. The first spacer 72 is located in the first frame 73 in a matrix, and the second spacer 82 is located in the second frame 83 in a matrix. An upper surface of the first frame 73 away from the first transfer base 71 is a smooth plane, and an upper surface of the second frame 83 away from the second transfer base 81 is a smooth plane. The structure of the first spacer 71 is equivalent to the structure of the second spacer 81, and the structure of the first frame 73 is equivalent to the structure of the second frame 83. In at least one embodiment, the first spacers 72 and the first frame 73 are integrally formed via a predetermined mask in a photolithography manner, and the second spacers 82 and the second frame 83 are integrally formed via a predetermined mask in a photolithography manner. The first spacer 72 and the second spacer 82 are substantially rectangular shaped. The first transfer base 71 and the second transfer base 81 are transparent glass substrates. In other embodiments, a shape of the first spacer 71 is different from a shape of the second spacer 81. The first spacers 71 and the second spacers 81 are arranged in a circle.

In block 802, a first adhesive frame 78 is formed surrounding the first frame 73, and a second adhesive frame 88 is formed surrounding the second frame 83. In at least one embodiment, the first adhesive frame 78 and the second adhesive frame 88 can be cured under a high temperature condition or an ultraviolet light condition.

In block 803, the first transfer base 71 is attached to a first substrate 74 to form a first substrate combination 76 in a vacuum chamber, and the second transfer base 81 is attached to a second substrate 84 to form a second substrate combination 86 in a vacuum chamber. The first adhesive frame 78 is used for improving an attaching force of the first substrate combination 76, and the second adhesive frame 88 is used for increasing an attaching force of the second substrate combination 86. A thickness of the first substrate 74 is in a range between 0.1-0.3 millimeter (mm), and a thickness of the second substrate 84 is in a range between 0.1-0.3 mm. In at least one embodiment, the thickness of the first substrate 74 is 0.2 mm, and the thickness of the second substrate 84 is 0.2 mm.

In detail, in the chamber, the first transfer base 71 faces the first substrate 74. The first transfer base 71 is attached to the first substrate 74 in response to a vacuuming of the chamber. The first transfer base 71 cooperates with the first substrate 74 and the first frame 73 to define a vacuum space in the first substrate combination 76. The first spacer 71 evenly supports the first substrate 74. In the chamber, the second transfer base 81 faces the second substrate 84. The second transfer base 81 is attached to the second substrate 84 in response to a vacuuming of the chamber. The second transfer base 81 cooperates with the second substrate 84 and the second frame 83 to define a vacuum space in the second substrate combination 86. The second spacer 81 evenly supports the second substrate 84. In at least one embodiment, the first substrate combination 76 and the second substrate combination 86 are formed in different chambers. In other embodiments, the first substrate combination 76 and the second substrate combination 86 are formed in the same chamber.

In block 804, a thin film transistor (TFT) array 77 is formed on a surface of the first substrate 74 away from the first transfer base 71, and a color filter layer 87 is formed on a surface of the second substrate 84 away from the second transfer base 81.

In block 805, the first substrate combination 76 is reversed to make the TFT array 77 face the color filter layer 87, a frame glue and filling liquid crystal are deposed between the first substrate combination 76 and the second substrate combination 86, and the first substrate combination 76 is attached to the second substrate combination 86.

In block 806, the first frame 73 and the first adhesive frame 78 are cut by a laser to form an air path for peeling the first transfer base 71; the second frame 83 and the second adhesive frame 88 are cut by a laser to form an air path for peeling the second transfer base 81; and the first transfer base 71 and the second transfer base 81 are removed to form the display panel 70. In at least one embodiment, the laser cuts a region of the first frame 73 and the first adhesive frame 78 corresponding to a gap between two adjacent first spacers 72, and cuts a region of the second frame 83 and the second adhesive frame 88 corresponding to a gap between two adjacent second spacers 82. In other embodiments, the first adhesive frame 78 and the second adhesive frame 88 can be completely removed with the laser.

Based on the first transfer base and the second transfer base, the thickness of the first substrate and the second substrate are decreased, and a smoothness of the upper surface of the first substrate and the second substrate are improved. Therefore, the manufacturing process for manufacturing the display panel is improved. The first transfer base and the second transfer base are capable of being recycled.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A method for manufacturing a display panel comprising:
    a) forming a plurality of first spacers and a first frame on a first transfer base, and forming a plurality of second spacers and a second frame on a second transfer base;
    b) attaching the first transfer base to a first substrate to form a first substrate combination in a vacuum chamber, and attaching the second transfer base to a second substrate to form a second substrate combination in a vacuum chamber;
    c) forming a TFT array on a surface of the first substrate away from the first transfer base, and forming a color filter layer on a surface of the second substrate away from the second transfer base;
    d) reversing the first substrate combination to make the TFT array face the color filter layer, setting a frame glue and filling liquid crystal between the first substrate combination and the second substrate combination, and attaching the first substrate combination to the second substrate combination; and
    e) cutting the first frame by a laser to form an air path for peeling the first transfer base, cutting the second frame by a laser to form an air path for peeling the second transfer base, and removing the first transfer base and the second transfer base to form the display panel.

2. The method of claim 1, wherein the first spacer is located in the first frame in a matrix, and the second spacer is located in the second frame in a matrix.

3. The method of claim 2, wherein the first spacers and the first frame are integrally formed via a predetermined mask in a photolithography manner, and the second spacers and the second frame are integrally formed via a predetermined mask in a photolithography manner.

4. The method of claim 1, wherein the first transfer base and the second transfer base are transparent glass substrates.

5. The method of claim 1, wherein a region of the first frame corresponding to a gap between two adjacent first spacers is cut by the laser, and a region of the second frame corresponding to a gap between two adjacent second spacers is cut by the laser.

6. The method of claim 1, wherein the first spacer and the second spacer are substantially rectangular shaped.

7. The method of claim 1, wherein the first spacer is substantially cylinder shaped.

8. The method of claim 1, wherein the first spacer is substantially a hollow cylinder shaped.

9. The method of claim 1, wherein a thickness of the first substrate is in a range between 0.1-0.3 mm, and a thickness of the second substrate is in a range between 0.1-0.3 mm.

10. A method for manufacturing a display panel comprising:
    a) forming a plurality of first spacers and a first frame on a first transfer base, and forming a plurality of second spacers and a second frame on a second transfer base;
    b) forming a first adhesive frame surrounding the first frame, and forming a second adhesive frame surrounding the second frame;
    c) attaching the first transfer base to a first substrate to form a first substrate combination in a vacuum chamber, and attaching the second transfer base to a second substrate to form a second substrate combination in a vacuum chamber;
    d) forming a TFT array on a surface of the first substrate away from the first transfer base, and forming a color filter layer on a surface of the second substrate away from the second transfer base;
    e) reversing the first substrate combination to make the TFT array face the color filter layer, setting a frame glue and filling liquid crystal between the first substrate combination and the second substrate combination, and attaching the first substrate combination to the second substrate combination; and
    f) cutting the first frame and the first adhesive frame by a laser to form an air path for peeling the first transfer base, cutting the second frame and the second adhesive frame by a laser to form an air path for peeling the second transfer base, and removing the first transfer base and the second transfer base to form the display panel.

11. The method of claim 10, wherein the first spacer is located in the first frame in a matrix, and the second spacer is located in the second frame in a matrix.

12. The method of claim 11, wherein the first spacers and the first frame are integrally formed via a predetermined mask in a photolithography manner, and the second spacers and the second frame are integrally formed via a predetermined mask in a photolithography manner.

13. The method of claim 10, wherein a region of the first frame corresponding to a gap between two adjacent first spacers is cut by the laser, and a region of the second frame corresponding to a gap between two adjacent second spacers is cut by the laser.

14. The method of claim 10, wherein the first spacer and the second spacer are substantially rectangular shaped.

15. The method of claim 10, wherein the first spacer is substantially cylinder shaped.

16. The method of claim 10, wherein the first spacer is substantially a hollow cylinder shaped.

17. The method of claim 10, wherein a thickness of the first substrate is in a range between 0.1-0.3 mm, and a thickness of the second substrate is in a range between 0.1-0.3 mm.

18. The method of claim 10, wherein the first adhesive frame and the second adhesive frame are completely removed by the laser.

* * * * *